(12) United States Patent
Yang et al.

(10) Patent No.: US 10,861,949 B2
(45) Date of Patent: Dec. 8, 2020

(54) THIN FILM TRANSISTOR SUBSTRATE

(71) Applicant: Samsung Display Co., Ltd., Yongin-si (KR)

(72) Inventors: Chan Woo Yang, Siheung-si (KR); Hyune Ok Shin, Gwacheon-si (KR); Chang Oh Jeong, Suwon-si (KR); Su Kyoung Yang, Yongin-si (KR); Dong Min Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/192,802

(22) Filed: Nov. 16, 2018

(65) Prior Publication Data
US 2019/0088752 A1 Mar. 21, 2019

Related U.S. Application Data

(62) Division of application No. 14/691,092, filed on Apr. 20, 2015, now Pat. No. 10,134,855.

(30) Foreign Application Priority Data

Nov. 19, 2014 (KR) .................. 10-2014-0161644

(51) Int. Cl.
*H01L 29/417* (2006.01)
*H01L 27/12* (2006.01)
*H01L 29/786* (2006.01)
*H01L 29/24* (2006.01)
(Continued)

(52) U.S. Cl.
CPC .... *H01L 29/41733* (2013.01); *H01L 27/1225* (2013.01); *H01L 29/24* (2013.01); *H01L 29/45* (2013.01); *H01L 29/7869* (2013.01); *C22C 29/12* (2013.01)

(58) Field of Classification Search
CPC .................................................. H01L 29/41733
See application file for complete search history.

(56) References Cited

U.S. PATENT DOCUMENTS 9,099,438 B2 8/2015 Park et al.
2010/0117075 A1* 5/2010 Akimoto ........... H01L 29/66742
257/43
(Continued)

FOREIGN PATENT DOCUMENTS

KR 10-2004-0025598 3/2004
KR 10-2006-0060335 6/2006
KR 10-2013-0126240 11/2013

OTHER PUBLICATIONS

Puchert, M. et al. (1996). Postdeposition annealing of radio frequency magnetron sputtered ZnO films. Journal of Vacuum Science & Technology A: Vacuum, Surfaces, and Films, 14(4), 2220.
(Continued)

*Primary Examiner* — Abul Kalam
(74) *Attorney, Agent, or Firm* — H.C. Park & Associates, PLC

(57) ABSTRACT

A thin film transistor includes a gate electrode, a semiconductor layer, and source and drain electrodes contacting the semiconductor layer. The source and drain electrodes include a metal oxide having a crystal size in a c-axis direction Lc(002) that ranges from 67 Å or more to 144 Å or less.

5 Claims, 8 Drawing Sheets

(51) Int. Cl.
*H01L 29/45* (2006.01)
*C22C 29/12* (2006.01)

(56) References Cited

U.S. PATENT DOCUMENTS

| | | | |
|---|---|---|---|
| 2010/0219415 A1* | 9/2010 | Park | H01L 21/02488 257/72 |
| 2012/0229742 A1* | 9/2012 | Yokoyama | G02F 1/133555 349/122 |
| 2013/0299817 A1 | 11/2013 | Park et al. | |
| 2013/0341181 A1 | 12/2013 | Park et al. | |
| 2015/0102335 A9 | 4/2015 | Shieh et al. | |
| 2015/0311234 A1 | 10/2015 | Park et al. | |

OTHER PUBLICATIONS

Lee, D., et al. (201 0). Organic acid-based wet etching behaviors of Ga-doped ZnO films sputter-deposited at different substrate temperatures. Thin Solid Films, 518(14), 4046-4051.

Non-Final Office Action dated May 19, 2017, issued in the U.S. Appl. No. 14/691,092.

Final Office Action dated Dec. 15, 2017, issued in the U.S. Appl. No. 14/691,092.

Notice of Allowance dated Jul. 25, 2018, issued in the U.S. Appl. No. 14/691,092.

* cited by examiner

THIN FILM TRANSISTOR SUBSTRATE

CROSS REFERENCE TO RELATED APPLICATIONS

This application is a Division of U.S. patent application Ser. No. 14/691,092, filed on Apr. 20, 2015, which claims priority from and the benefit of Korean Patent Application No. 10-2014-0161644, filed on Nov. 19, 2014, which are hereby incorporated by reference for all purposes as if fully set forth herein.

BACKGROUND

Field

Exemplary embodiments of the present invention relate to a thin film transistor substrate.

Discussion of the Background

In general, a flat panel display device, such as a liquid crystal display device or an organic light emitting display device, includes pairs of electric field generating electrodes, and electro-optical active layers interposed therebetween. The liquid crystal display device typically includes a liquid crystal layer as an electro-optical active layer, and the organic light emitting display device typically includes an organic light emitting layer as an electro-optical active layer.

One of the electric field generating electrodes of the pair is generally connected to a switching element to receive an electric signal, and the electro-optical active layer converts the electric signal to an optical signal to display an image.

The flat panel display device generally uses a thin film transistor (TFT) including a three-terminal element as a switching element, signal lines such as gate lines for transmitting a scan signal for controlling the thin film transistor, and data lines for transmitting a signal applied to a pixel electrode.

The above information disclosed in the Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a thin film transistor substrate with an improved yield.

Additional features of the invention will be set forth in the description which follows, and in part will be apparent from the description, or may be learned by practice of the invention.

An exemplary embodiment of the present invention discloses a thin film transistor, including a gate electrode; a semiconductor layer; and source/drain electrodes that are in contact with the semiconductor layer, the source/drain electrodes including a metal oxide having a crystal size in a c-axis direction Lc(002) in a range between 67 Å and 144 Å.

Another exemplary embodiment of the present invention discloses a thin film transistor, including a gate electrode; a semiconductor layer; and a capping layer including first metal oxide of which a crystal size in a c-axis direction between 67 Å and 144 Å; a barrier layer including a second metal oxide of which a crystal size in the c-axis direction Lc(002) is smaller than 67 Å; and source/drain electrodes including a metal layer disposed between the capping layer and the barrier layer.

Another exemplary embodiment of the present invention discloses a thin film transistor, including a gate electrode; a semiconductor layer; and source/drain electrodes including a metal layer and a barrier layer, the barrier layer being interposed between the metal layer and the semiconductor layer and including metal oxide of which a crystal size in a c-axis direction between 67 Å and 144 Å.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
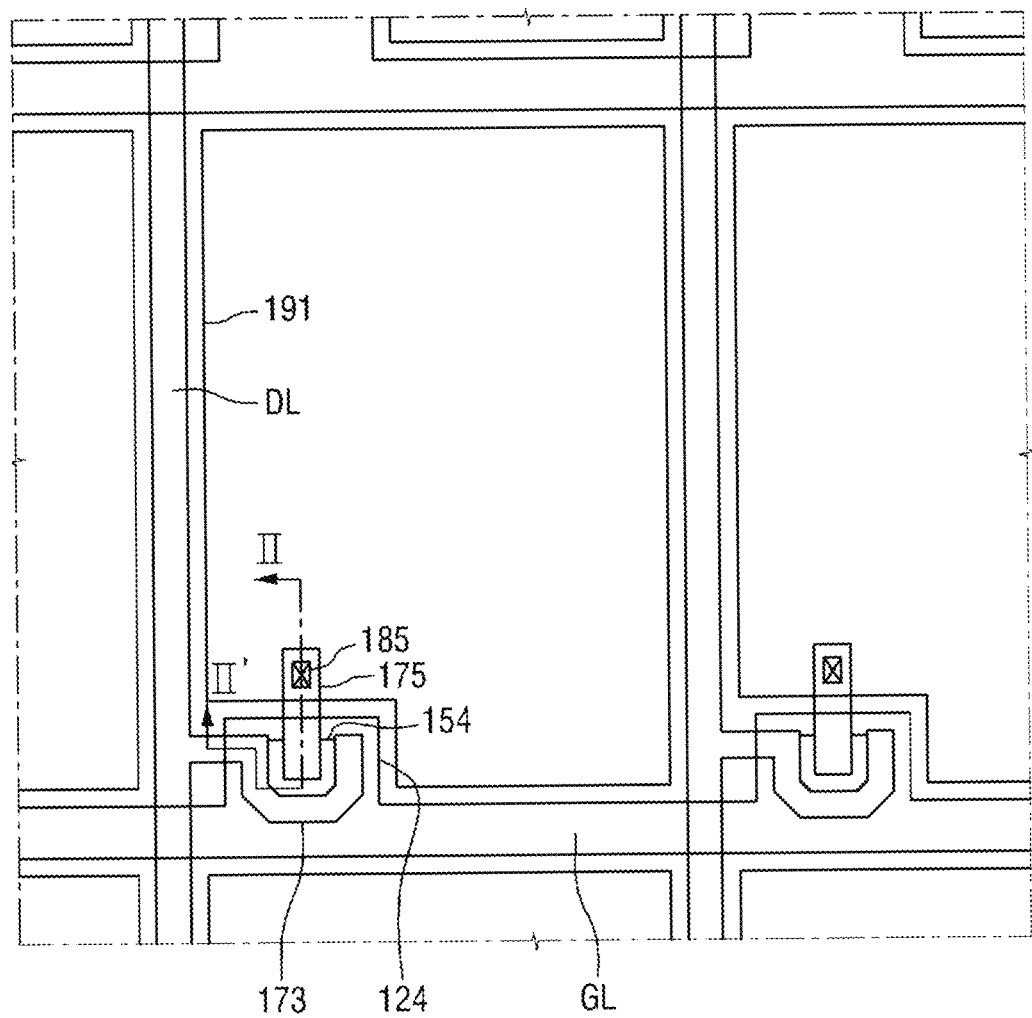
FIG. 1 is a schematic layout diagram of a thin film transistor substrate according to exemplary embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the present invention will be described with reference to the drawings.

Figure 2:
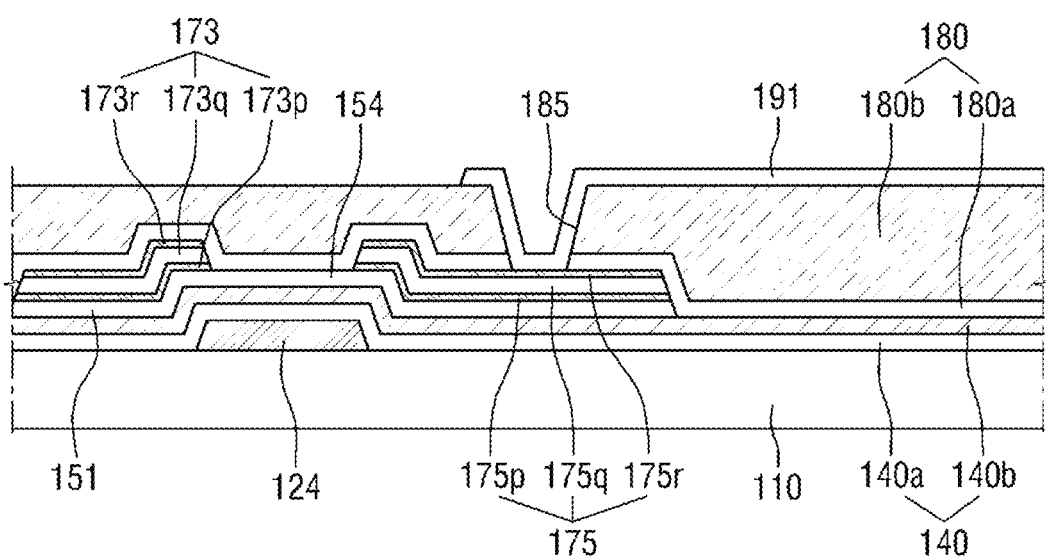
FIG. 2 is a schematic cross-sectional view taken along line of FIG. 1.

FIG. 1 is a schematic layout diagram of a thin film transistor substrate according to exemplary embodiments of the present invention. FIG. 2 is a schematic cross-sectional view taken along line II-IF of FIG. 1.

Referring to FIGS. 1 and 2, a thin film transistor substrate according to exemplary embodiments of the present invention may include an insulation substrate 110, gate lines GL, gate electrodes 124, data lines DL, source electrodes 173, drain electrodes 175, a semiconductor layer 151, pixel electrodes 191, and the like.

The thin film transistor substrate may have a structure in which the gate line GL, the gate electrode 124, the semiconductor layer 151, the source electrode 173, the drain electrode 175, and the pixel electrode 191 are sequentially stacked on the insulation substrate 110.

The insulation substrate 110 may be formed of transparent glass or a composite resin.

The gate line GL may transmit a gate signal, and be extended on the insulation substrate 110 in a substantially horizontal direction. The gate electrode 124 may protrude from the gate line GL toward the pixel electrode 191. For example, the gate line GL and the gate electrode 124 may be formed of an aluminum based metal, such as aluminum (Al) and an aluminum alloy, a silver based metal, such as silver (Ag) and a silver alloy, a copper based metal, such as copper (Cu) and a copper alloy, a molybdenum based metal, such as molybdenum (Mo) and a molybdenum alloy, chrome (Cr), titanium (Ti), tantalum (Ta), etc.

The data line DL may transmit a data signal, and may extend on the insulation substrate 110 in a vertical direction. The source electrode 173 may protrude from the data line DL, and partially overlap the gate electrode 124. The source electrode 173 may have a "U" shape as illustrated in the drawings, but the shape is not limited thereto. The drain electrode 175 is disposed separate from the source electrode 173. The drain electrode 175 may partially overlap the gate electrode 124. For example, the drain electrode 175 may be disposed within a valley of the "U"-shaped source electrode 173. The drain electrode 175 may be in contact with the pixel electrode 191 through a contact hole 185.

Each of the data line DL, the source electrode 173, and the drain electrode 175 may have a stacked structure including capping layers 173r and 175r, metal layers 173q and 175q, and barrier layers 173p and 175p. The metal layers 173q and 175q may be disposed between the capping layers 173r and 175r and the barrier layers 173p and 175p.

The metal layers 173q and 175q may serve as a main wire layer for transmitting a data signal. For example, the metal layers 173q and 175q may be formed of nickel (Ni), cobalt (Co), titanium (Ti), silver (Ag), copper (Cu), molybdenum (Mo), aluminum (Al), beryllium (Be), niobium (Nb), gold (Au), iron (Fe), and/or the like.

The capping layers 173r and 175r may prevent the metal layers 173q and 175q from being oxidized, and the barrier layers 173p and 175p may prevent metal elements forming the metal layers 173q and 175q from being diffused. The barrier layers 173p and 175p may serve as ohmic contact layers.

The capping layers 173r and 175r and the barrier layers 173p and 175p will be described in detail with reference to FIGS. 3 to 8 below.

The pixel electrode 191 may be disposed within a region where the gate line GL and the data line DL cross each other. For example, the pixel electrode 191 may be a transparent electrode formed of an indium-titanium oxide (ITO) or an indium-zinc oxide (IZO). The pixel electrode 191 may receive a data voltage from the drain electrode 175 through the contact hole 185.

The semiconductor layer 151 may be disposed on the gate electrode 124, and under the source electrode 173 and the drain electrode 175. The semiconductor layer 151 may be an oxide semiconductor layer. The semiconductor layer 151 may include at least one of zinc (Zn), indium (In), tin (Sn), gallium (Ga), and hafnium (Hf). For example, the semiconductor layer 151 may be formed of an indium-gallium-zinc oxide (IGZO). The semiconductor layer 151 may include a protrusion 154. The protrusion 154 may be partially exposed between the source electrode 173 and the drain electrode 175.

Referring to FIG. 2, a gate insulation layer 140 may be disposed between the insulation substrate 110 and the gate electrode 124. The gate insulation layer 140 may cover the entire surface of the gate electrode 124. The gate insulation layer 140 may include a first insulation layer 140a and a second insulation layer 140b. For example, the first insulation layer 140a may be formed of silicon nitride (SiNx) having a thickness of about 4,000 Å, and the second insulation layer may be formed of silicon oxide ($SiO_2$) having a thickness of about 500 Å. The first insulation layer 140a may be formed of silicon oxynitride (SiON) and the second insulation layer 140b may be formed of silicon oxide ($SiO_2$), but is not limited thereto. The gate insulation layer 140 may also be configured as a single layer unlike the illustration, but this is merely exemplary and is not limited thereto.

The semiconductor layer 151 may be disposed on the gate insulation layer 140. The semiconductor layer 151 may be formed in a region overlapping the gate electrode 124. The semiconductor layer 151 may be partially covered by the source electrode 173 and the drain electrode 175. The protrusion 154 may be in contact with a passivation layer. The source electrode 173 and the drain electrode 175 may be disposed on the same plane and may be spaced apart from each other. A passivation layer 180 may be formed on the source electrode 173 and the drain electrode 175.

The passivation layer 180 may be formed of an inorganic insulating material, such as silicon nitride or silicon oxide, an organic insulating material, and/or a low dielectric constant insulating material. The passivation layer 180 may include a first passivation layer 180a and a second passivation layer 180b. For example, the first passivation layer 180a may be formed of silicon oxide, and the second passivation layer 180b may be formed of silicon nitride. The pixel electrode 191 may be disposed on the passivation layer 180.

Hereinafter, the capping layers 173r and 175r and the barrier layers 173p and 175p will be described in detail.

The capping layers 173r and 175r may include metal oxide having a crystal size Lc(002) in the c-axis direction that ranges from 67 Å or more to 144 Å or less. The capping layer 173r and 175r may prevent the metal layer 173q and 175q from being oxidized and corroded.

For example, in a comparative embodiment, when the passivation layer formed of silicon oxide is deposited, the data line DL and the drain electrode 175 may be lifted by copper oxide (CuOx) generated by direct contact between the metal layers 173q and 175q formed of copper and the passivation layer 180. Additionally or alternatively, the data line DL and the drain electrode 175 may be corroded when the contact hole 185 is formed in the passivation layer 180. However, according to exemplary embodiments of the present invention, the capping layers 173r and 175r are positioned under the passivation layer 180, so that it is possible to prevent the data line DL and the drain electrode 175 from being lifted and corroded.

The capping layers 173r and 175r may include metal oxide having a crystal size Lc(002) in the c-axis direction that ranges between 67 Å and 144 Å, and a dopant. When the capping layers 173r and 175r include the dopant, a content of metal oxide may be in a range between 70 weight % and 85 weight % based on the total weight of the capping layer 173r and 175r, and a content of the dopant may be in a range between 15 weight % and 30 weight % based on the total weight of the capping layers 173r and 175r.

When the crystal size Lc(002) in the c-axis direction in a range between 67 Å and 144 Å, and the content of the metal oxide is in a range between 70 weight % and 85 weight % based on the total weight of the capping layers 173r and 175r, it is possible to restrict a tip from being generated in the capping layers 173r and 175r, and prevent the capping layers 173r and 175r from being eroded.

The tip of the capping layers 173r and 175r is a sharp tip protruding from surfaces of the capping layers 173r and 175r. The tip of the capping layers 173r and 175r may be generated during a patterning process of the source/drain electrodes 173 and 175. The tip of the capping layers 173r and 175r may be separated from the capping layers 173r and 175r by physical pressure, and the separated tip may flow into the thin film transistor substrate to cause a defect when a channel part of the semiconductor layer 151 is formed or stripped during the manufacturing process. Further, the tip of the capping layers 173r and 175r may generate a crack in the passivation layer 180.

According to an exemplary embodiment, the metal oxide having the crystal size Lc(002) in the c-axis direction that ranges between 67 Å and 144 Å may be zinc oxide (ZnO), and the dopant may be gallium (Ga), indium (In), aluminum (Al), and the like. The capping layers 173r and 175r may be formed of one of a gallium-zinc oxide (GZO) layer, an aluminum-zinc oxide (AZO) layer, and an indium-zinc oxide (IZO) layer.

The gallium-zinc oxide (GZO) layer may include zinc oxide (ZnO) in a range between 70 weight % and 85 weight % and gallium (Ga) in a range between 15 weight % and 30 weight %. The aluminum-zinc oxide (AZO) layer may include zinc oxide (ZnO) in a range between 70 weight % and 85 weight % and aluminum (Al) in a range between 15 weight % and 30 weight %. The indium-zinc oxide (IZO) layer may include zinc oxide (ZnO) in a range between 70 weight % and 85 weight % and indium (In) in a range between 15 weight % and 30 weight %.

The metal oxide having the crystal size Lc(002) in the c-axis direction that ranges from between 67 Å and 144 Å may be fabricated by adjusting deposition power, increasing a flow of inert gas, for example, argon (Ar), or increasing a deposition temperature during a process of depositing the capping layers 173r and 175r on the metal layers 173q and 175q. The metal oxide having the crystal size Lc(002) in the c-axis direction that ranges from between 67 Å and 144 Å may also be fabricated by a method of depositing the capping layers 173r and 175r on the metal layers 173q and 175q and then performing a heat treatment.

Table 1 below shows that a crystal size in (002) plane of the zinc oxide (ZnO) may be increased by adjusting deposition power.

TABLE 1

|  | Deposition power (kW) | FWHM | 2 θ(degree) | Crystal size in (002) plane of ZnO (Å) |
|---|---|---|---|---|
| Center | 25 | 0.8884 | 33.790 | 103.9 |
|  | 38 | 0.8544 | 33.700 | 108.0 |
|  | 50 | 1.0484 | 33.668 | 88.03 |
| Edge | 25 | 0.8855 | 33.668 | 104.2 |
|  | 38 | 0.9821 | 33.73 | 93.99 |
|  | 50 | 1.0132 | 33.674 | 91.09 |

Referring to Table 1, at the center, a crystal size is increased when deposition power is 38 kW, and a crystal size is decreased when deposition power is 50 kW. By contrast, at the edge, when deposition power is increased from 25 kW, 38 kW, to 50 kW, a crystal size is decreased.

A tip is mainly generated in the capping layers 173r and 175r at the edge, so that it is possible to increase a crystal size of the zinc oxide (ZnO) by decreasing deposition power at the edge, compared to the center.

Table 2 below shows that a crystal size in (002) plane of the zinc oxide (ZnO) may be increased by adjusting a flow of Argon (Ar).

TABLE 2

| Deposition power (kW) | Ar(sccm) | Ar(Pa) | FWHM | 2 θ(degree) | Crystal size in (002) plane of ZnO (Å) |
|---|---|---|---|---|---|
| 50 | 100 | 0.33 | 0.8747 | 32.791 | 105.27 |
| 50 | 300 | 0.98 | 0.6397 | 32.824 | 143.96 |

Referring to FIG. 2, it can be seen that a crystal size in (002) plane of the zinc oxide (ZnO) is increased in proportion to an increase in a flow of Argon (Ar) under the same deposition power.

Figure 3:
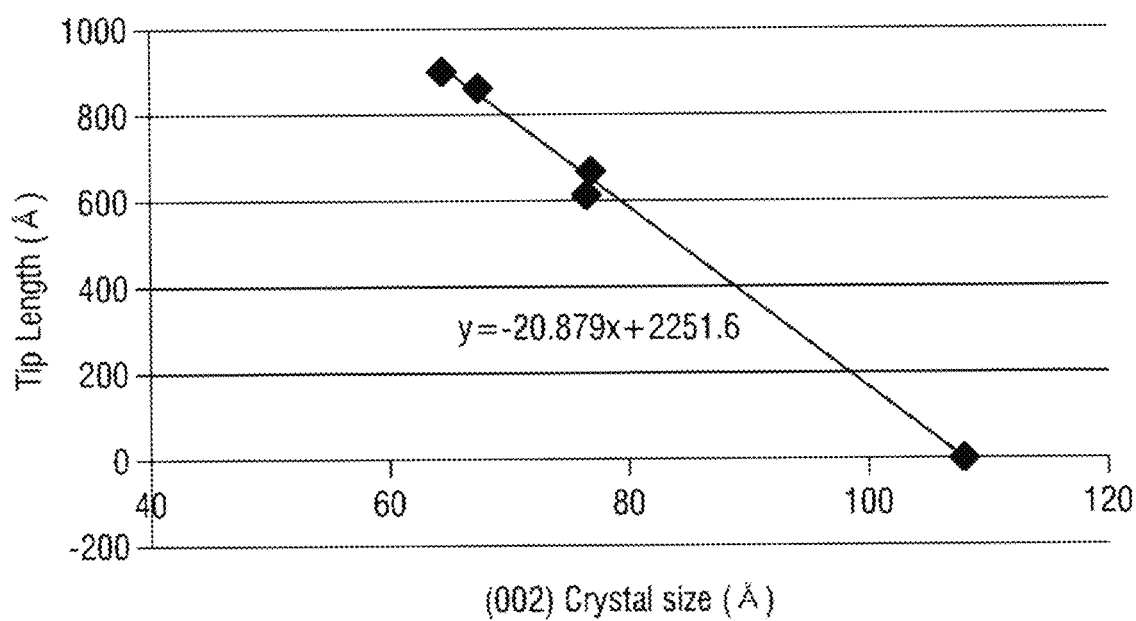
FIG. 3 is a relationship graph of tip length and crystal size Lc(002) in a c-axis direction of a capping layer of FIG. 1.

FIG. 3 is a graph relating a length of the tip generated in the capping layers 173r and 175r to a crystal size Lc(002) in the c-axis direction of the capping layers 173r and 175r. Referring to FIG. 3, a horizontal axis represents a crystal size Lc(002) in the c-axis direction and a vertical axis represents a length of the tip of the capping layer 173r and 175r. As the thin film transistor substrates used in the exemplary embodiment shown in FIG. 3, indium-gallium-zinc oxide (IGZO) is used in the semiconductor layer, copper is used in the metal layer of the source/drain electrodes, and indium-zinc oxide (IZO), in which a weight ratio of zinc oxide (ZnO) and indium oxide ($In_2O_3$) is 8:2, is used in the barrier layer and the capping layer. Unlike the barrier layer, a crystal size in (002) plane of the zinc oxide of the capping layer is increased by adjusting a deposition temperature, deposition power, and the like, as described above.

Figure 4:
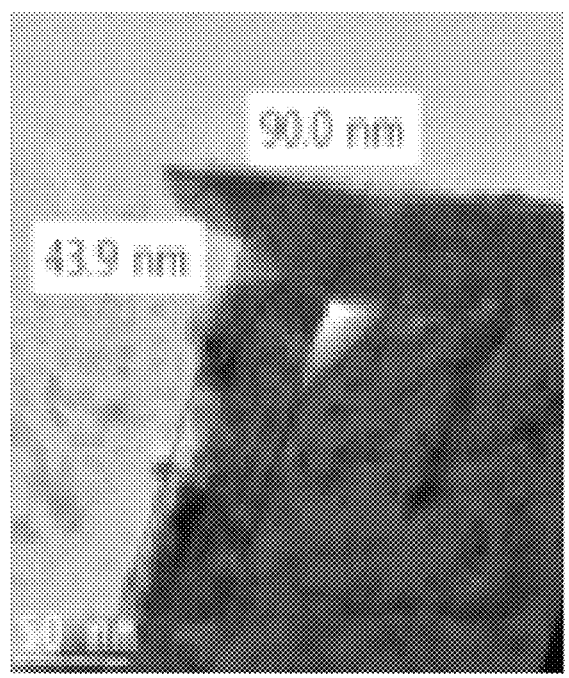
FIGS. 4, 5, 6, 7, and 8 are scanning electronic microscope (SEM) pictures of source/drain electrodes of FIG. 1.
Figure 5:
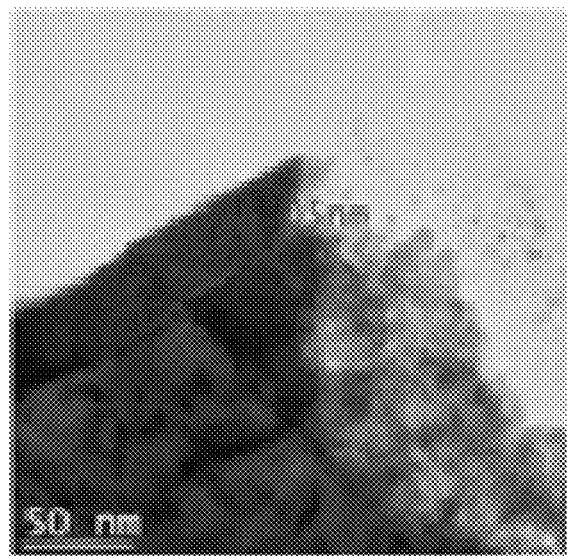
Figure 6:
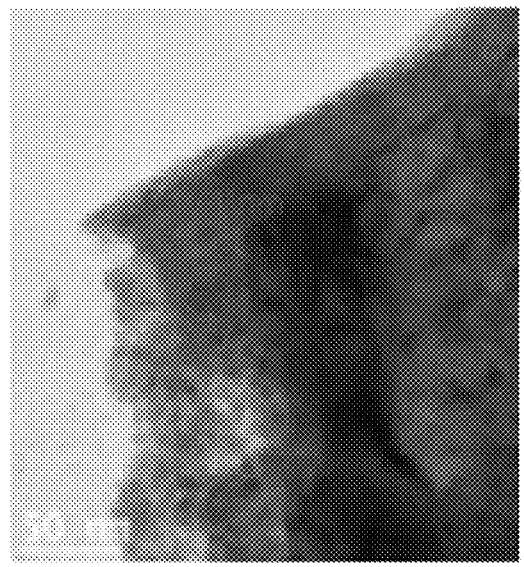
Figure 7:
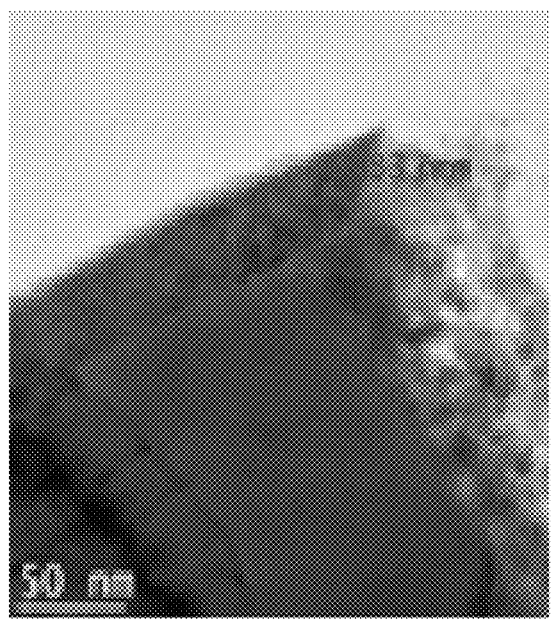
Figure 8:

Referring to FIGS. 3 to 8 and Table 3 below, when the crystal size Lc(002) in the c-axis direction is 64.5 Å, a length of the tip is 900 Å (see FIG. 4). By contrast, when the crystal size Lc(002) in the c-axis direction is 67.5 Å, a length of the tip is 861 Å (see FIG. 5), when the crystal size Lc(002) in the c-axis direction is 76.6 Å (see FIG. 6), a length of the tip is 603 Å, when the crystal size Lc(002) in the c-axis direction is 76.9 Å, a length of the tip is 667 Å (see FIG. 7), and when the crystal size Lc(002) in the c-axis direction is 108.0 Å, a length of the tip is 0 Å (see FIG. 8). It can be seen from the result of the experiment that when the crystal size Lc(002) in the c-axis direction is increased, a length of the tip is decreased.

TABLE 3

| Crystal size Lc(002) in c-axis direction (Å) | Length (Å) of tip | Existence of tip protruding over a boundary surface of GZO layer and Cu layer |
|---|---|---|
| 64.5 | 900 | Existence (439 Å) |
| 67.5 | 861 | Non-existence |
| 76.6 | 603 | Non-existence |
| 76.9 | 667 | Non-existence |
| 108.0 | 0 | Non-existence |

When the crystal size Lc(002) in the c-axis direction is 64.5 Å, a length of the tip protruding over a boundary surface of the GZO layer and the Cu layer is 439 Å (see FIG. 4). By contrast, when the crystal sizes Lc(002) in the c-axis direction are 67.5 Å, 76.6 Å, 76.9 Å, and 108.0 Å, a tip protruding over a boundary surface of the GZO layer and the Cu layer is not observed (see FIGS. 5, 6, 7, and 8).

The crystal size in (002) plane of the zinc oxide (ZnO) in the c-axis direction may be measured by using the Scherrer Equation (Equation (1) below).

$$T = \frac{K\lambda}{\beta\cos\theta} \quad \text{Equation (1)}$$

In Equation (1), T is a mean size of aligned crystal domains, K is a dimensionless shape factor, $\lambda$ is an x-ray wavelength, $\beta$ is a line broadening at half maximum (FWHM) in radians, and $\theta$ is a Bragg angle.

The barrier layers 173p and 175p may include metal oxide having a crystal size Lc(002) in the c-axis direction that ranges from 67 Å to 144 Å. The metal oxide having the crystal size Lc(002) in the c-axis direction that ranges from 67 Å to 144 Å may be fabricated by increasing deposition power, increasing a flow of inert gas, for example, argon (Ar), or increasing a deposition temperature during a process of depositing the barrier layers 173p and 175p on the semiconductor layer 151. The metal oxide having the crystal size Lc(002) in the c-axis direction that ranges from 67 Å to 144 Å may also be fabricated by depositing the barrier layers 173p and 175p on the semiconductor layer 151 and then performing a heat treatment.

The barrier layers 173p and 175p may include metal oxide having a crystal size Lc(002) in the c-axis direction that ranges from 67 Å to 144 Å, and a dopant.

For example, the barrier layer may be one of bare zinc oxide (ZnO), a gallium-zinc oxide (GZO) layer, an aluminum-zinc oxide (AZO) layer, and an indium-zinc oxide (IZO) layer.

The gallium-zinc oxide (GZO) layer may include zinc oxide (ZnO) in a range between 77.2 weight % and 94.4 weight % and gallium (Ga) in a range of 5.6 weight % to 22.8 weight %. The gallium (Ga) or a gallium oxide ($Ga_2O_3$) within the content range may prevent an undercut to enable the barrier layer to serve as a diffusion prevention layer, prevent tailing generable in the barrier layer during an etching process, and prevent a short at a boundary of the channel parts of the semiconductor layer 151.

The aluminum-zinc oxide (AZO) layer may include zinc oxide (ZnO) in a range of 50 mol % to 97.5 mol % and aluminum (Al) in a range of 2.5 mol % to 50 mol %. The aluminum (Al) or aluminum oxide ($Al_2O_3$) within the content range may prevent an undercut to enable the barrier layer to serve as a diffusion prevention layer, prevent tailing generable in the barrier layer during an etching process, and prevent a short at a boundary of the channel parts of the semiconductor layer 151.

The indium-zinc oxide (IZO) layer may include zinc oxide (ZnO) in a range of 10 weight % to 97.5 weight % and indium (In) in a range of 2.5 weight % to 90 weight %. The indium-zinc oxide (IZO) layer may include zinc oxide (ZnO) in a range of 60 weight % to 80 weight % and indium (In) in a range of 20 weight % to 40 weight %. The indium (In) or an indium oxide ($In_2O_3$) within the content range may prevent an undercut to enable the barrier layer to serve as a diffusion prevention layer, prevent tailing generable in the barrier layer during an etching process, and prevent a short at a boundary of the channel parts of the semiconductor layer 151.

The barrier layers 173p and 175p may include a metal oxide having a crystal size Lc(002) in the c-axis direction of smaller than 67 Å. As mentioned above, the metal oxide having a crystal size Lc(002) in the c-axis direction that ranges from between 67 Å to 144 Å may be fabricated by increasing deposition power, increasing a flow of inert gas, for example, argon (Ar), or increasing a deposition temperature during a process of depositing the barrier layers 173p and 175p on the semiconductor layer 151. By contrast, the metal oxide having the crystal size Lc(002) in the c-axis direction of smaller than 67 Å may be fabricated by a method, such as a method of decreasing deposition power, a method of decreasing a flow of inert gas, or a method of adjusting a deposition temperature to a room temperature condition.

According to exemplary embodiments of the present invention, in the thin film transistor substrate, it is possible to minimize inflow of impurities generated from source/drain electrodes.

According to exemplary embodiments of the present invention, in the thin film transistor substrate, it is possible to restrict a crack from being generated within a passivation layer.

According to exemplary embodiments of the present invention, in the thin film transistor substrate, it is possible to minimize an undercut of a barrier layer.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A thin film transistor substrate, comprising:
   a semiconductor layer; and
   a barrier layer disposed on the semiconductor layer and comprising a second metal oxide having a crystal size in the c-axis direction Lc(002) less than 67 Å;
   a capping layer disposed on the barrier layer and comprising a first metal oxide having a crystal size in a c-axis direction LC(002) greater than 67.5 Å and less than 108 Å;
   source and drain electrodes disposed between the capping layer and the barrier layer, and each of the source and drain electrodes comprising a metal layer.

2. The thin film transistor substrate of claim 1, wherein each of the first metal oxide and the second metal oxide comprises one of a bare zinc oxide (ZnO) layer, a gallium-zinc oxide (GZO) layer, an aluminum-zinc oxide (AZO) layer, and an indium-zinc oxide (IZO) layer.

3. The thin film transistor substrate of claim 2,
   wherein the first metal oxide comprising the gallium-zinc oxide (GZO) layer comprises zinc oxide (ZnO) between 70 weight % and 85 weight % and gallium (Ga) between 15 weight % and 30 weight %,
   wherein the first metal oxide comprising the aluminum-zinc oxide (AZO) layer comprises zinc oxide (ZnO) between 70 weight % and 85 weight % and aluminum (Al) between 15 weight % and 30 weight %, and
   wherein the first metal oxide comprising the indium-zinc oxide (IZO) layer comprises zinc oxide (ZnO) between 70 weight % and 85 weight % and indium (In) between 15 weight % and 30 weight %.

4. The thin film transistor substrate of claim 2,
   wherein the second metal oxide comprising the gallium-zinc oxide (GZO) layer comprises zinc oxide (ZnO) between 77.2 weight % and 94.4 weight % and gallium (Ga) between 5.6 weight % and 22.8 weight %,
   wherein the second metal oxide comprising the aluminum-zinc oxide (AZO) layer comprises zinc oxide (ZnO) between 50 mol % and 97.5 mol % and aluminum (Al) between 2.5 mol % and 50 mol %, and
   wherein the second metal oxide comprising the indium-zinc oxide (IZO) layer comprises zinc oxide (ZnO) between 10 weight % and 97.5 weight % and indium (In) between 2.5 weight % and 90 weight %.

5. The thin film transistor substrate of claim 4 wherein the second metal oxide comprising the indium-zinc oxide (IZO) layer comprises zinc oxide (ZnO) between 60 weight % and 80 weight % and indium (In) between 20 weight % and 40 weight %.

* * * * *